US009337853B2

(12) United States Patent
Nakamura et al.

(10) Patent No.: US 9,337,853 B2
(45) Date of Patent: May 10, 2016

(54) INTERLEAVED A/D CONVERTER

(75) Inventors: Yohei Nakamura, Tokyo (JP); Takashi Oshima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/421,512

(22) PCT Filed: Sep. 7, 2012

(86) PCT No.: PCT/JP2012/072837
§ 371 (c)(1),
(2), (4) Date: Feb. 13, 2015

(87) PCT Pub. No.: WO2014/038056
PCT Pub. Date: Mar. 13, 2014

(65) Prior Publication Data
US 2015/0341044 A1    Nov. 26, 2015

(51) Int. Cl.
*H03M 1/06* (2006.01)
*H03M 1/12* (2006.01)
*H03M 1/36* (2006.01)

(52) U.S. Cl.
CPC .......... *H03M 1/0626* (2013.01); *H03M 1/0624* (2013.01); *H03M 1/121* (2013.01); *H03M 1/1245* (2013.01); *H03M 1/36* (2013.01); *H03M 1/1215* (2013.01)

(58) Field of Classification Search
CPC ..... H03M 1/005; H03M 7/30; H03M 1/0626; H03M 1/0624; G06F 3/0416
USPC .................. 341/122, 118, 120, 144, 159, 161
See application file for complete search history.

(56) References Cited

U.S. PATENT DOCUMENTS 8,487,895 B1 *  7/2013  Brown .................. G06F 3/0416
                                                                345/156
2008/0018502 A1 *  1/2008  Wegener ................. H03M 7/30
                                                                341/50

(Continued)

FOREIGN PATENT DOCUMENTS

JP       2002-217732 A     8/2002
WO     WO 02/059632 A1     8/2002
WO   WO 2009/090514 A1     7/2009

(Continued)

OTHER PUBLICATIONS

Poulton et al., "A 20GS/8b ADC with a 1MB Memory in 0.18 μm CMOS", 2003 IEEE International Solid-State Circuits Conference, ISSCC Digest of Technical Papers, pp. 318-319, Feb. 2003.
Oshima et al., "LMS calibration of sampling timing for time-interleaved A/D converters", Electronics Letters, vol. 45, pp. 615-617, No. 12, Jun. 2009.

*Primary Examiner* — Peguy Jean Pierre
(74) *Attorney, Agent, or Firm* — Miles & Stockbridge P.C.

(57) ABSTRACT

It is a problem that each ADC sampling circuit connected in parallel in an interleaved ADC releases an electric charge depending on an input signal when sampling is performed and other ADCs connected in parallel sample the input signal disturbed thereby so that resolution of the interleaved ADC is decreased.
The problem is improved by inputting a common differential sampling clock signal to one set of two ADCs which is sampled at a π-phase shift of each ADC connected in parallel in a time interleaved ADC, providing an individual buffer in a prior stage of an input sampling circuit, isolating a common analog input signal line from an ADC input terminal, and digitally correcting characteristics degradation by insertion of the buffer.

17 Claims, 9 Drawing Sheets

(56) References Cited

U.S. PATENT DOCUMENTS

2011/0128171 A1    6/2011    Oshima et al.
2014/0232577 A1*   8/2014    Noguchi ............... H03M 1/005
                                                                                                                      341/118

FOREIGN PATENT DOCUMENTS

WO    WO 2010/095232 A1    8/2010
WO    WO 2011/106071 A2    9/2011

* cited by examiner (a)

(b)

(c)

INTERLEAVED A/D CONVERTER

TECHNICAL FIELD

The present invention relates to an interleaved A/D converter.

BACKGROUND ART

An analog/digital converter (hereinafter, referred to as ADC) is required for a computer that is operated by a digital signal to process physical information converted into an analog electrical signal by a sensor.

High performance is always required for the ADC used in a measuring device according to requirement of performance improvement of a measuring apparatus such as an inspection apparatus that is used for manufacturing semiconductors in which miniaturization is processed and a medical diagnostic apparatus having a high speed and high resolution for more accurate diagnosis.

However, a speed of single ADC that can perform sampling while maintaining an effective resolution in 10 bit or more may be limited to approximately 250 MHz from rate-limiting derived from frequency characteristics of a transistor configuring the ADC.

Thus, a technique called time interleaving has been noted in which a plurality of ADCs are parallelized, time difference is provided in each sampling timing, and high speed of a conversion speed is achieved as a whole.

For example, it is possible to perform the sampling at a speed of 1/1 [ns]=1 [GS/s] as a whole by connecting four unit ADCs of 8 [bit] and 250 [MS/s] ([S/s] is a unit representing the number of times of samplings in 1 [s]; when an interval of the sampling is T, T=1/250 [MS/9]=4 [ns]) to the same analog signal line in parallel and by performing the sampling by shifting the sampling timing by a width of 1 [ns]. Several ADCs having a sampling rate of a speed exceeding a performance limit of a CMOS transistor have been developed by using the technique.

Meanwhile, the technique is also limited in the resolution to be guaranteed due to mismatch such as DC offset of each ADC which is connected in parallel, variation of a conversion gain, and a deviation of sampling clock timing.

However, in recent years, also with respect to the problem, a scheme for correcting the mismatch between the ADCs in a digital signal region after AD converting is performed has been disclosed in PTLs 1 and 2, or NPLs 2 and 3, and the mismatch problem is headed to be solved.

However, the mismatch problem is solved and a clue is found in the improvement of the effective resolution while maintaining the high speed of the interleaved ADC, but new problem occurs.

Here, NPL 1 illustrates a typical configuration example of the interleaved ADC. In NPL 1, the ADCs are realized in which 80 ADCs of 250 MS/s and 8 bits are connected in parallel and which have the sampling rate of 20 GS/s.

The technique takes a form in which the analog input signal transported to the ADC is received at a high speed buffer and is distributed in an ADC sampling circuit (circuit described as 80 T/H in NPL 1) connected in parallel to a subsequent state.

However, each ADC sampling circuit releases an electric charge with respect to an input in a sampling clock edge and another parallel ADC samples the signal disturbed by the electric charge, and thereby a problem that the effective resolution is limited occurs. Here, it is important that the digital correction scheme cannot be effective against irregular factors and leads to a decrease in the effective resolution.

Since the electric charge released from the input of the ADC irregularly depends on the input signal, an existing digital correction scheme cannot be applied. In NPL 1, this issue is not a problem if a target of the effective resolution is 8 bit, but a new problem to be a barrier occurs in realizing the resolution greater than this.

CITATION LIST

Patent Literature

PTL 1: WO2010/095232
PTL 2: JP-A-2002-217732

Non Patent Literature

NPL 1: Ken Poulton, Robert Neff, Brian Setterberg, Bernd Wuppermann, Tom, Kopley, Robert Jewett, Jorge Pe nillo, Cha le Tan, Allen Montijo, "A 20GS/8b ADC with a 1 MB Memory in 0.18 um CMOS", ISSCC Digest of Technical Papers, pp. 318-319, February 2003.

NPL 2: Takashi Oshima, Tomomi Takahashi and Taizo Yamawaki, "LMS calibration of sampling timing for time-interleaved A/D converters," Electronics Letters, Vol. 45, pp. 615-617, June 2009.

NPL 3: T. Oshima, T. Takahashi and T. Yamawaki, "LMS calibration of sampling timing for time-interleaved A/D converters," Electronics Letters, Vol. 45, pp. 615-617, June 2009.

SUMMARY OF INVENTION

Technical Problem

Each ADC sampling circuit which is connected in parallel in the interleaved ADC performs release of the electric charge depending on the input signal when sampling is performed and then other ADCs connected in parallel sample the input signal disturbed thereby. Thus, a problem to be solved by the invention is that the resolution of the interleaved ADC is decreased.

Solution to Problem

The problem can be reduced by inputting a common differential sampling clock signal to one set of two ADCs which are sampled at a π-phase shift of each ADC connected in parallel in an interleaved ADC, providing an individual buffer in a prior stage of an input sampling circuit, isolating a common analog input signal line from an ADC input terminal, and digitally correcting characteristics degradation by insertion of the buffer.

Advantageous Effects of Invention

According to the invention, the sampling timing of paired ADCs that are likely to be the greatest interference from symmetry of a differential signal is accurately inscribed with a π-phase difference by the common sampling clock. Thus, the interference between ADC inputs due to an error from an ideal value of the ADC sampling timing is suppressed. Furthermore, the input signal is transmitted to the ADC sampling circuit of the subsequent stage by the buffer, but the electric charge released from the ADC sampling circuit is blocked by the buffer and is not transmitted to the common analog input signal line. Other ADCs connected in parallel do not interfere with each other and the characteristics degradation by the

BRIEF DESCRIPTION OF DRAWINGS

FIG. 9 is a diagram illustrating an embodiment of a FIR filter for obtaining a differential value d (d2(k, t−XT))/dt or the like.

DESCRIPTION OF EMBODIMENTS

First Embodiment

Figure 1:
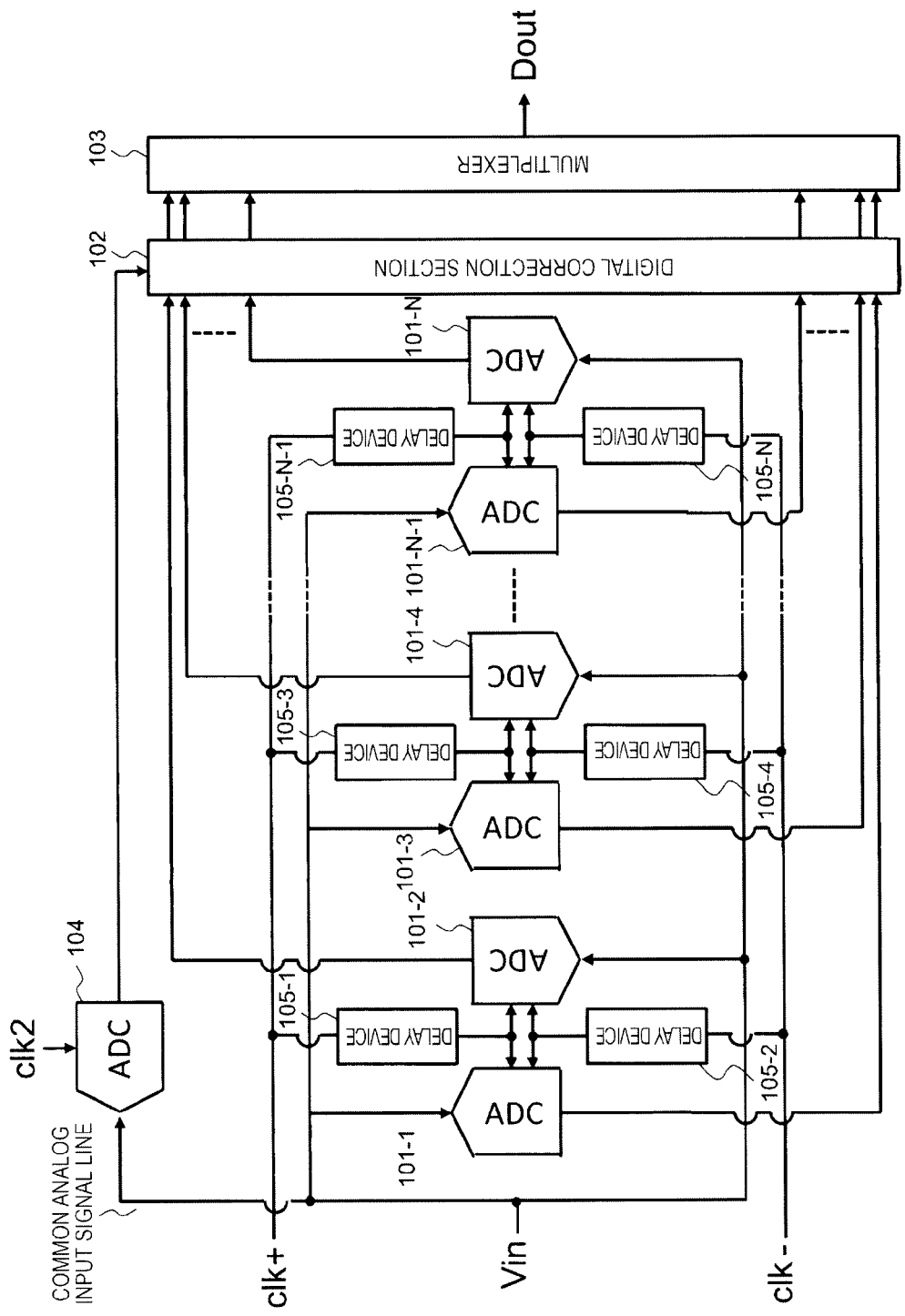
FIG. 1 is a diagram describing a first embodiment.

FIG. 1 illustrates an embodiment of an interleaved ADC according to a first embodiment.

In the embodiment, analog input terminals of N ADCs 101-$k$ (k=integer from 1 to N and N is a multiple of 2) having differential input clock terminals are connected to a common analog input signal line. In addition, an input terminal of a reference ADC 104 is connected to the common analog input signal line.

Figure 2:
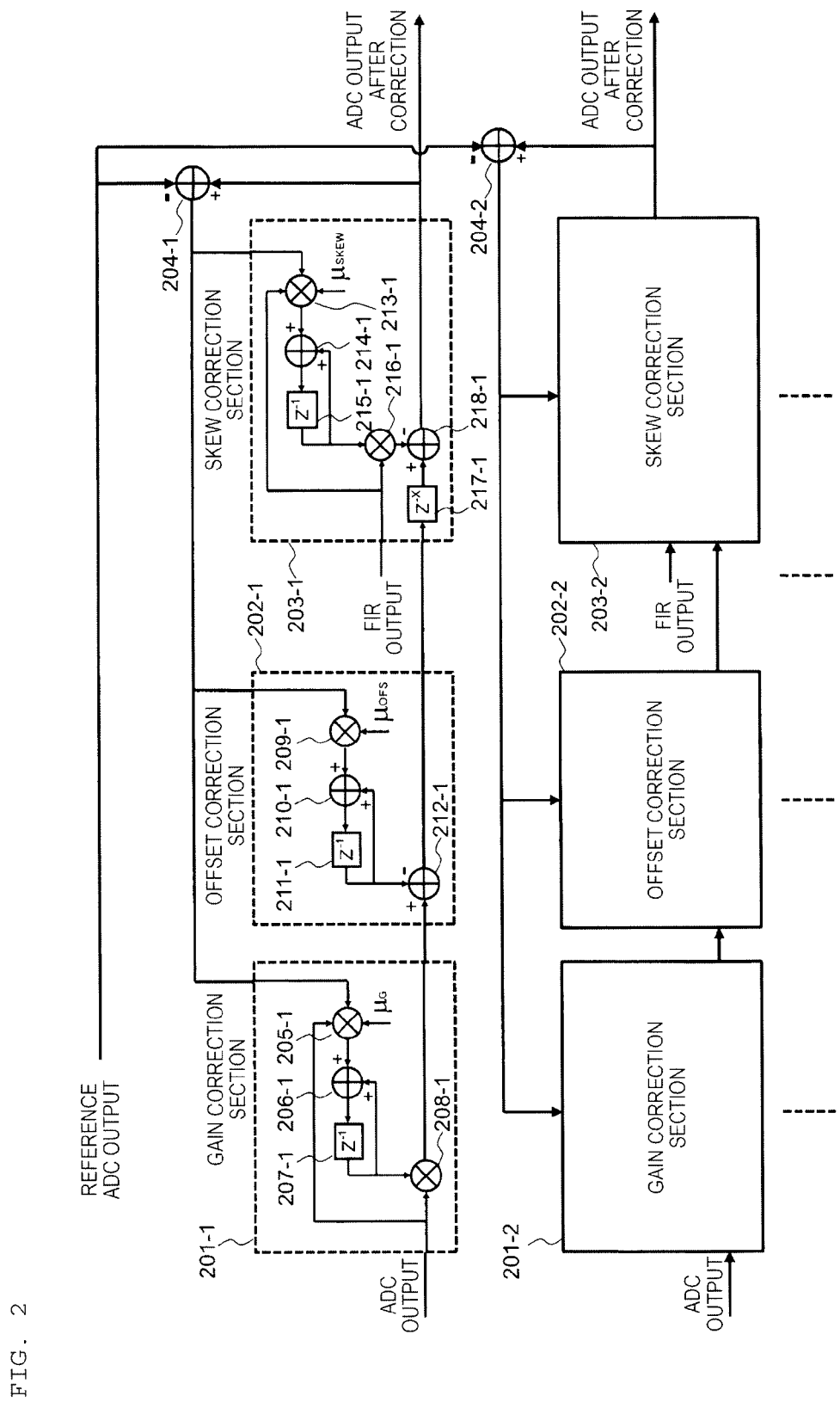
FIG. 2 is a diagram describing an embodiment of a digital correction section in the first embodiment.

Here, the ADC 101-$k$ and the reference ADC 104 include an input sampling circuit. A digital output of each ADC 101-$k$ is connected to a digital correction section 102 and a mismatch between each of AD conversion paths such as DC offset, deviation of conversion gain, and a shift of sampling timing that occur in each AD conversion path is corrected from comparison an output of the ADC 104 with an output of each ADC 101-$k$. Hereinafter, in each ADC 101-$k$, ideal sampling timing, without shifting, refers to timing as sampling intervals are equal to each other between adjacent ADCs 101-$k$ in all sampling timings. FIG. 2 illustrates a specific configuration of the digital correction section. An AD conversion result that is output from each ADC 101-K is connected to each of gain correction sections 201-$k$ (k is an integer of 1 to N) and gain mismatch is corrected. Corrected output offset is corrected by an offset correction section 202-$k$ connected to the gain correction section 201-$k$. A corrected output result is further corrected by a skew correction section 203-$k$ and is output to a multiplexer 103. Here, skew is a shift from ideal sampling timing of the sampling in each ADC 101-$k$. The gain correction section, the offset correction section, and the skew correction section obtain a difference of a result output from the reference ADC 104 and the skew correction section using a subtractor 204-$k$ and determine each correction value so as to reduce the difference value (hereinafter, referred to as e(k)). Hereinafter, a specific embodiment of the digital correction section is described. Furthermore, a detailed mechanism of the digital correction is disclosed in NPLs 2 and 3.

AD conversion data (d0 (k, t)) output from each unit ADC 101-$k$ is input into the gain correction section 201-$k$. In the gain correction section 201-$k$, the difference e(k) from the ideal AD conversion result obtained by the subtractor 204-$k$ is multiplied by the AD conversion result d0 (k, t) and a gain correction loop factor μG by a multiplier 205-$k$. An output result of the multiplier 205-$k$ is input into an adder 206-$k$ and is combined with an adder output before one clock cycle delayed by a delay device 207-$k$. According to the configuration, an output value AG (k, t) of the delay device 207-$k$ is a value that is obtained by integrating the output of the multiplier 205-$k$ from starting of digital correction. Here, the structure configured of the adder 206-$k$ and the delay device 207-$k$ is generally known as an integrator. AG (k, t) corresponds to a gain error between the reference ADC 104 and the unit ADC 101-$k$, and AG (k, t) is multiplied by the AD conversion data d0 (k, t) by a multiplier 208-$k$ and is output as an output d1 (k, t) of the gain correction section 201-$k$.

The output result d1 (k, t) corrected by the gain correction section 201-$k$ is input into the offset correction section 202-$k$. In the offset correction section 202-$k$, the difference value e(k) from the ideal conversion result and an offset correction loop coefficient μOFS are multiplied by a multiplier 209-$k$. An output result of the multiplier 209-$k$ is input into an adder 210-$k$ and is combined with an output of the adder before one clock cycle delayed by a delay device 211-$k$. According to the configuration, the output value ΔV (k, t) of the delay device 211-$k$ is a value obtained by integrating the output of the multiplier 209-$k$ from starting the digital correction. ΔV (k, t) corresponds to an offset error between the reference ADC 104 and the unit ADC 101-$k$, and the input data d1 (k, t) is subtracted by ΔV (k, t) by an adder 212-$k$ and is output as an output d2 (k, t) of the offset correction section 202-$k$.

The output result d2 (k, t) corrected by the offset correction section 202-$k$ is input into the skew correction section 203-$k$. A time differential value d(d2 (k, t−XT))/dt of d2 (k, t) is also input into the skew correction section 202-$k$. Here, XT [s] is a delay time necessary for calculating the differential value by the FIR filter and the like, and T [s] is one clock cycle period. The d(d2 (k, t−XT))/dt can be calculated by the FIR filter and the like and a detailed method will be described below.

In the skew correction section 203-$k$, the difference e (k) from the ideal AD conversion result obtained by the subtractor 204-$k$ is multiplied by d(d2 (k, t−XT))/dt and a skew correction loop coefficient μSKEW by a multiplier 213-$k$. The output result of the multiplier 213-$k$ is input into an adder 214-$k$ and is combined with the output of the adder before one clock cycle delayed by a delay device 215-$k$. According to the configuration, an output value Δt (k, t) of the delay device 215-$k$ is a value obtained by integrating the output of the multiplier 214-$k$ from starting of the digital correction. At (k, t) corresponds to a sampling timing error between the reference ADC 104 and the unit ADC 101-$k$ and Δt (k, t) is multiplied by d(d2 (k, t−XT))/dt by a multiplier 216-$k$. At (k, t)×d(d2 (k, t−XT))/dt that is a result thereof corresponds to an error of the AD conversion result generated by the sampling timing error. The input data d2 (k, t) is input into a delay device 217-$k$ and an output d2 (k, t−XT) of the delay device 217-$k$ is subtracted by Δt (k, t)×d(d2 (k, t−XT))/dt that is the output of the multiplier 216-$k$ and is output as an output d3 (k, t) of the skew correction section 203-$k$ in an adder 218-K.

Figure 9:
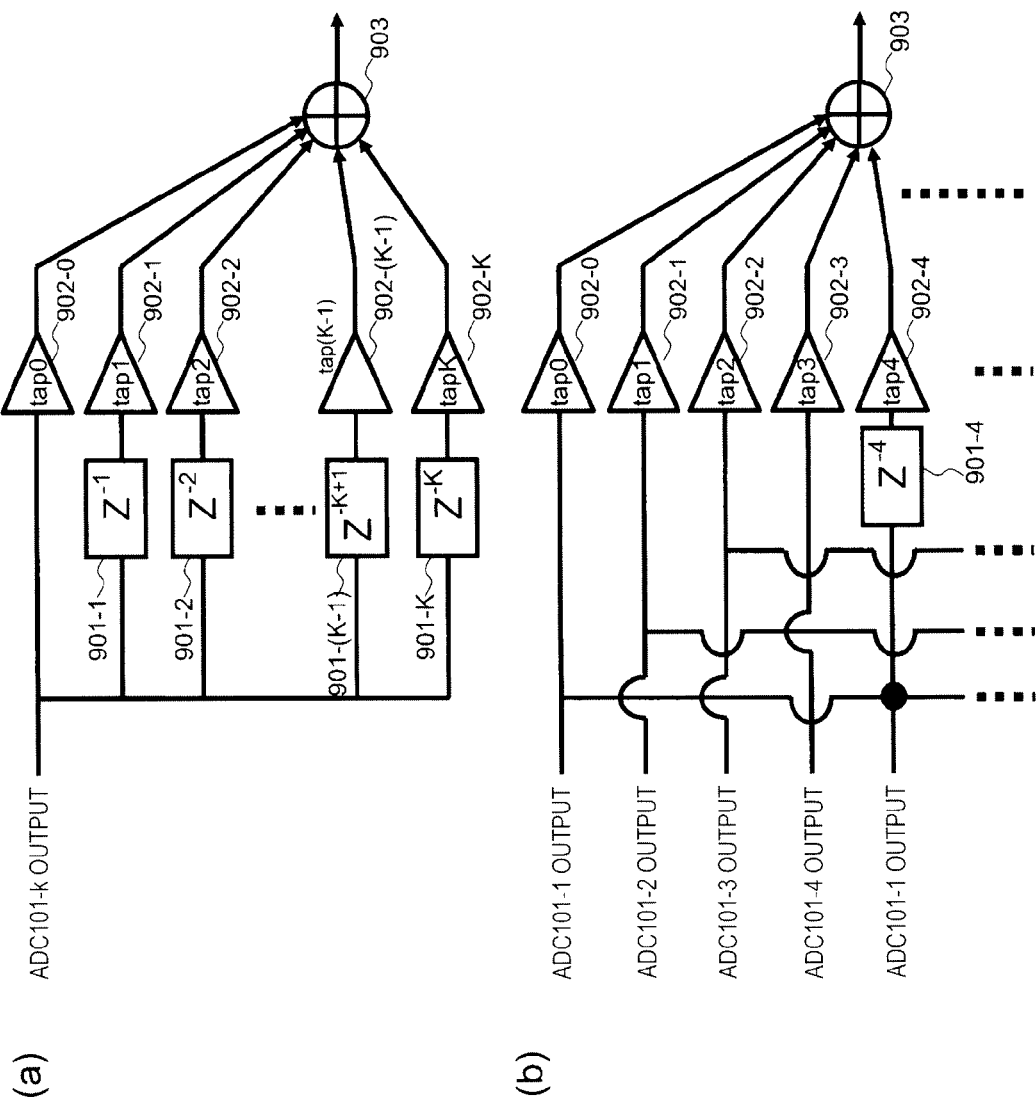

FIG. 9(a) illustrates an example of an embodiment of the FIR filter for obtaining the differential value d(d2 (k, t−XT))/dt. The output d2 (k, t) of the offset correction section of FIG. 2 is input into the FIR filter and the FIR filter is configured of each delay device 901-$n$ (n is an integer of 1 to K) connected to the input terminal, a tap section 902-$n$ which is connected to a subsequent stage of the delay device and which applies a weighting factor, and an adder 903 that adds an output to which the weighting factor is applied. Furthermore, as illustrated in FIG. 9 (b), it is possible to input the ADC outputs different from each other. Here, an example in which four ADCs are interleaved operated is described. The outputs of the ADC 101-$k$ are respectively input into the delay block 901-$n$ or the tap section 902-$n$, and the outputs of the delay block 901-$n$ are input into 902-$n$ and are respectively multiplied by the weighting factor. The outputs obtained by multiplying each weighting factor are summed in the adder 903 and are output. At this time, it is possible to obtain the differential value $d(d2(k, t-XT))/dt$ from the adder 903 by making the weighting factor be an appropriate value in each tap section 902-$n$.

The AD conversion result of each ADC 101-$k$ corrected by the digital correction section 102 is integrated by the multiplexer 103 and is output as a series of time-series data.

Furthermore, each ADC 101-1 (1 is an odd number of 1 to N) has an ADC 101-$m$ (m is an even number of 1 to N) to be paired, a positive input clock terminal of each ADC 101-1 is connected to a negative input clock terminal of the ADC 101-$m$ to be paired, and a negative input clock terminal of each ADC 101-1 is connected to a positive input clock terminal of the ADC 101-$m$ to be paired.

A differential clock signal line is connected to the differential input clock terminal of the ADC 101-1 and the ADC 101-$m$ connected to each other through a delay device 105-$k$ and the sampling clock signal of a frequency fs is input into the differential input clock terminal.

At this time, the sampling clock signal input into the differential clock signal line directly connected to each ADC 101-1 is distributed in N/2 types of sampling clocks having a phase difference of $k/(fs·N)$ on a basis of the phase of the sampling clock signal of any one frequency fs.

Furthermore, two positive and negative signal lines of the differential input signal line may be respectively connected to one of two signal lines connecting clock terminals of the ADC 101-1 and the ADC 101-$m$.

Hereinafter, effects obtained by this configuration will be described.

In this configuration, a value of an analogue input signal Vin that is AD converted at a sampling rate fs is output from each ADC 101-$k$ as the digital signal and they have a complementary relationship with each other.

That is, when a time when one ADC 101-$k$ performs the AD conversion of the input is t, a time when the same ADC 101-$k$ performs the next AD conversion thereof is $t+1/fs$. The ADC 101-1 (1 is a natural number of any one of 1 to N different from k) that performs sampling at the time $t+1/(fs·N)$ by the sampling clock phase relationship described above is present.

Then, a digital output Dout by AD converting Vin at intervals of $t+1/(fs·N)$ is obtained from the multiplexer and as a result, the AD conversion is performed at the sampling rate of fs·N.

As described above, even if the interleaved ADC of the structure in which each ADC connected in parallel complements the sampling interval with each other and thereby the sampling speed is improved is generally well-known, a characteristic of the embodiment is that the positive input clock terminal of each ADC 101-1 is connected to the negative input clock terminal of the ADC 101-$m$ to be paired and the negative input clock terminal of each ADC 101-1 is connected to the positive input clock terminal of the ADC 101-$m$ to be paired. Even if one type of sampling clock signal is shared between the ADC 101-1 and the ADC 101-$m$ to be paired by such connection, since the clock input terminals are connected in a positive/negative reversed state, the sampling clocks of phases reverse to each other are input and operated between the ADC 101-1 and the ADC 101-$m$.

As a result, the ADCs 101-$k$ to be paired sample the input signals and perform AD conversion with a time difference of $1/(fs·2)$ from each other.

Here, in order to describe the effects of the embodiment, a problem to be solved by the embodiment will be described. Generally, the ADC 101-$k$ performs ON and OFF of a switch in a sampling mechanism inside thereof in moments of rising and falling of the sampling clock input into the ADC 101-$k$ (hereinafter, referred to as clock edges). At this time, a kickback phenomenon in which an electric charge accumulated in a sampling capacitor and an electric charge accumulated in a transistor configuring the switch are respectively released from the input terminal of the ADC 101-$k$ is observed and the input signal is disturbed.

Here, for example, the ADC 101-$k$ samples the input in falling of the sampling clock and is transferred to the sampling period in rising of the sampling clock. The strongest influence received by the ADC 101-$k$ is the disturbance of the input that is generated just beforehand. Here, two ADCs 101-$k$ (referred to as the ADC 1 and the ADC 2) connected in parallel to the common analog input terminal are considered.

For example, if the sampling clock signals generated by paths different from each other with respect to the ADCs are input and each sampling clock signal has a phase difference of $1/(fs·2)$, the timing of the clock edge is shifted in the ADC 1 and the ADC 2 by a phase difference generation method of the sampling clock and the influence of a wiring path. An event that the ADC 2 disturbs the analog input signal in the clock edge input into the ADC 2 just before the ADC 1 samples is generated. For example, if a signal having an amplitude of 400 mV and a frequency of 50 MHz is input into the ADC having an input signal frequency band of appropriately 500 MHz, a kickback component is approximately 3 mV. If the ADC 1 samples the input signal as it is before the kickback component converges, it becomes weaker by 8 bit in terms of the effective resolution.

However, in the embodiment, since the connection of the sampling clock input into the ADC 2 is different from that of the sampling clock input into the ADC 1 but is the same as each other, the clock edge timing is almost simultaneous. Thus, if a time when the disturbance of the input generated by the ADC 2 is transmitted to the signal line and reaches the input terminal of the ADC 1 is considered, input disturbance generated by the ADC 2 does not affect the sampling of the ADC 1. This is because if a time is t1 when the ADC 1 generates a disturbance component to the input signal line in the clock edge timing, the ADC 2 samples exactly simultaneously with t1. Then, since there is a delay ($\Delta t$) due to a line length of the signal line until the disturbance component generated by the ADC 1 is transmitted to the signal line and arrives in the ADC 2, a time of arrival of the disturbance component generated by the ADC 1 in the input of the ADC 2 is $t1+\Delta t$ and is later than t1 that is the sampling timing of the ADC 2.

Thus, the sampling of the ADC 2 does not receive the influence of the disturbance by the ADC 1. This is also similar to when the ADC 2 samples and is similar to other ADC 101-$k$ pairs. The embodiment is provided to avoid a phenomenon in which the input signal just after the disturbance is generated by the shift of the timing between the sampling clocks is sampled and to secure the minimum period of $1/(fs·N)$ for converging the disturbed input. Furthermore, the embodiment is characterized in that a digital correction section is further included and the reason and effects will be described below.

In the embodiment, since one type of sampling clock signal is shared between the ADC 101-1 and the ADC 101-$m$ to be paired and the clock input terminals are connected in a positive/negative reversed state, the sampling clocks of phases reverse to each other are input and operated between the ADC 101-1 and the ADC 101-m. As a result, the ADCs 101-k to be paired sample the input signal having the time difference of 1/(fs·2) with each other and perform the AD conversion as described above, thereby guaranteeing an accurate time difference of 1/(fs·2) from the nature of the differential sampling clock signal in the sampling timing between the ADCs to be paired. However, it is difficult to accurately inscribe the phase relationship with other ADCs that are not paired in 1/(fs·N) when generating the sampling clock and there is a problem that the resolution of the ADC is decreased by the sampling timing error between the ADC sampling circuits. In the embodiment, a problem that the sampling timing between the ADCs described above is shifted from the ideal value is solved by correcting the sampling timing error using the reference ADC 104 and the digital correction section 102.

Figure 3:
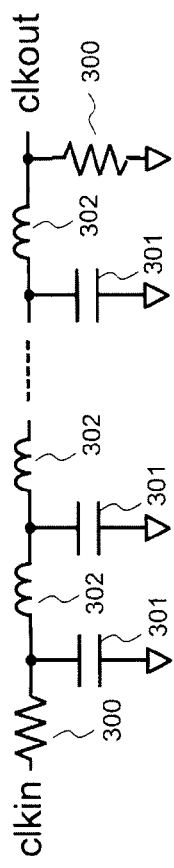
FIG. 3 is a diagram describing an example of an embodiment of a delay device in the first embodiment.
Figure 3:
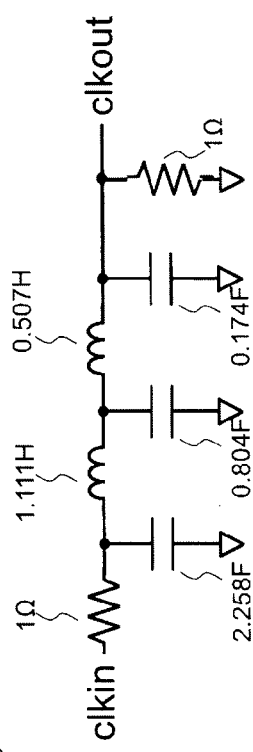
Figure 3:
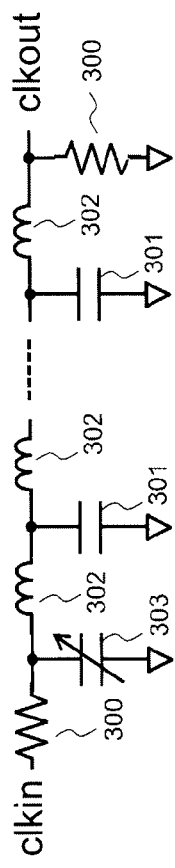

Here, as an example for generating N/2 types of clocks having the phase of k/(fs·N) described above from differential clock signals (clk+ and clk−) as the reference, an LC filter delay device using an inductance element 300 and a capacitance element 301 is illustrated in FIG. 3 (a). For the LC filter, a generally known filter type named a Butterworth filter, a Chebyshev filter, and the like by characteristics thereof exists. Here, for example, the LC filter called a Bessel filter in which changes in delay characteristics in a wide frequency band are small is described as an example. Each element constant of a 5-order π-type Bessel filter standardized in a cutoff frequency of 1/2π[Hz] and in an impedance of 1 [Ω] is illustrated in FIG. 3 (b). In order to convert the impedance while maintaining the characteristics of the filter, if the impedance of a destination of the conversion is R [Ω], as K=R/1, all impedance element values are multiplied by K and all capacitance element values may be divided by K. Furthermore, if each cutoff frequency is fc [Hz] of the destination of the conversion to convert each cutoff frequency, as M=fc×2π, all inductance element values and the capacitance element values may be divided by M. Since a delay amount of the signal input into the filter depends on the frequency of the input signal, the cutoff frequency of the filter, and the order number of the filter, M is obtained so as to generate a delay of an appropriate amount with respect to a sampling clock frequency fs and the filter may be designed using a circuit simulator or numerical calculation. Furthermore, as illustrated in FIG. 3(c), an adjustable width of the delay amount can be provided by changing one of the capacitance elements 301 with a variable capacitor 303.

Second Embodiment

Figure 4:
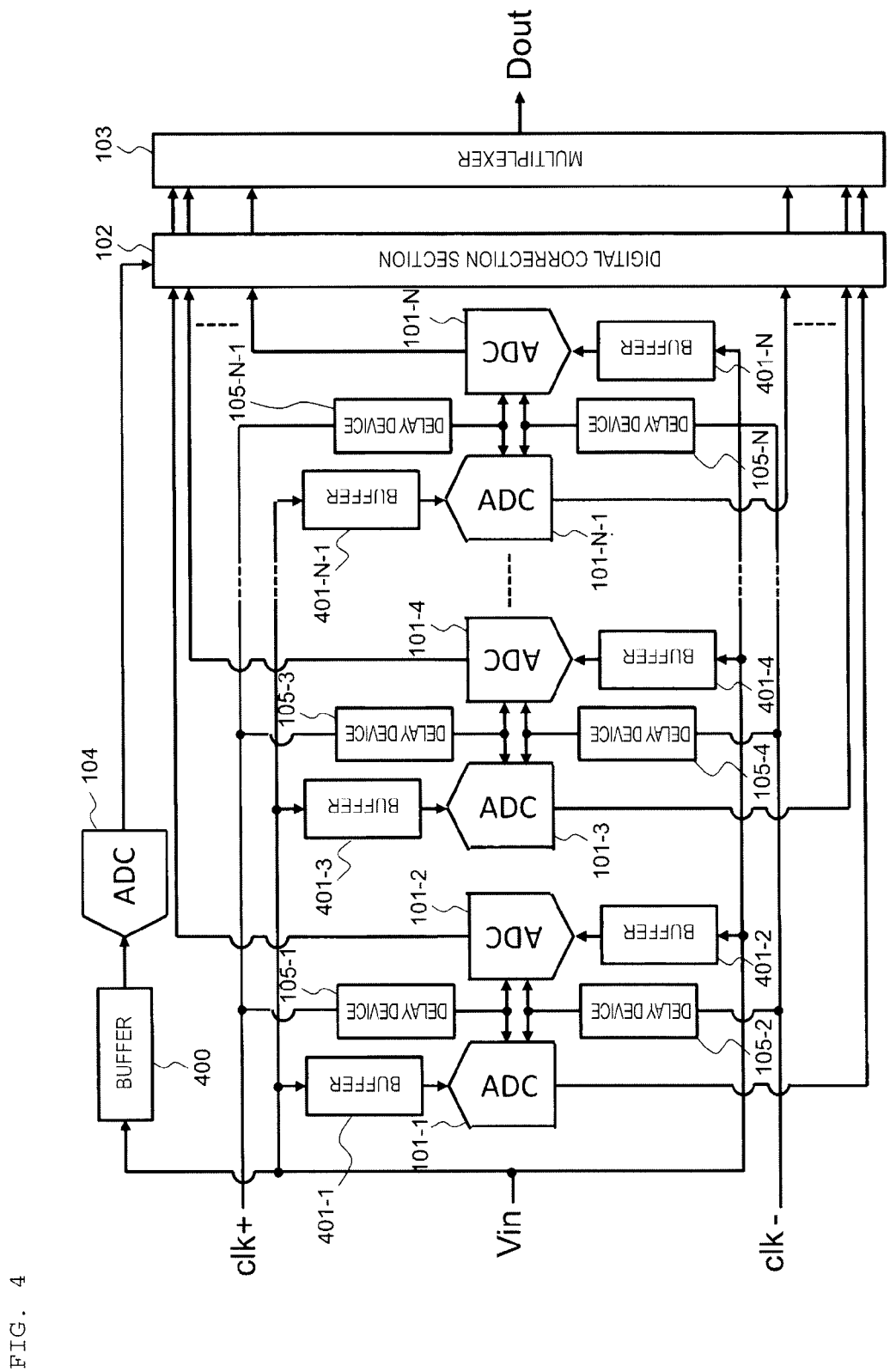
FIG. 4 is a diagram describing a second embodiment.

FIG. 4 illustrates an embodiment of an interleaved ADC according to a second embodiment.

The embodiment illustrates an example of solutions for further reduce the problem in which the kickback component of the ADC in the first embodiment disturbs the input signal.

In the embodiment, analog input terminals of N ADCs 101-k (k=integer of 1 to N and N is a multiple of 2) having differential input clock terminals are connected to an output terminal of a buffer section 401-k and an input terminal of the buffer section 401-k is connected to a common analog input signal line. In addition, an input terminal of a buffer section 400 is connected to the common input signal line and an input terminal of the reference ADC 104 is connected to an output terminal of the buffer section 400. Here, the ADC 101-k and the reference ADC 104 include an input sampling circuit. A digital output of each ADC 101-k is connected to the digital correction section 102 and similar to the first embodiment, a mismatch between AD conversion paths such as DC offset, deviation of conversion gain, and a shift of sampling timing that occur in each AD conversion path is corrected from comparison with an output of the ADC 104.

An AD conversion result of each ADC 101-k corrected by the digital correction section 102 is integrated by the multiplexer 103 and is output as a series of a time-series data.

Furthermore, each ADC 101-1 (1 is an odd number of 1 to N) has the ADC 101-m (m is an even number of 1 to N) to be paired, a positive input clock terminal of each ADC 101-1 is connected to a negative input clock terminal of the ADC 101-m to be paired, and a negative input clock terminal of each ADC 101-1 is connected to a positive input clock terminal of the ADC 101-m to be paired.

A differential clock signal line is connected to the differential input clock terminal of the ADC 101-1 and the ADC 101-m connected to each other through the delay device 105-k and the sampling clock signal of a frequency fs is input into the differential input clock terminal.

At this time, the sampling clock signal input into the differential clock signal line directly connected to each ADC 101-1 is distributed in N/2 types of sampling clocks having a phase difference of k/(fs·N) when taking the phase of the sampling clock signal of any one frequency fs as a reference.

Furthermore, two positive and negative signal lines of the differential input signal line may be respectively connected to one of two signal lines connecting between the clock terminals of the ADC 101-1 and the ADC 101-m.

A characteristic of the embodiment is the buffer section 401-k that is provided between the ADC 101-k and the common analog input signal line.

An example of the embodiment of the buffer section illustrated in FIG. 5(a) takes a negative feedback configuration in which an analog signal input line is connected to a non-inverting input terminal of an operational amplifier 500 and an output terminal of the operational amplifier 500 is connected to an inverting input terminal, and the non-inverting input terminal of the operational amplifier 500 is grounded through a capacitor 501.

Furthermore, if the analog input terminal of the ADC 101-k requests a differential input, as illustrated in FIG. 5(b), a differential operational amplifier 502 is connected to an output of the operational amplifier 500, and it is possible to differentiate the analog input signal, and it does not matter that an analog input terminal of a unit ADC is single ended or is differential.

Effects obtained by the configuration with respect to the problem described in the first embodiment that the kickback causes the disturbance of the input signal to the input line of the ADC in the clock edge will be described.

In the first embodiment, it is possible to prevent the sampling of the signal that is disturbed by shift of the sampling timing between the ADCs by using the common differential clock signal as the sampling clock between the ADCs to be paired. However, it is not possible to measure with respect to a case where the influence of the disturbance caused by other ADCs that are not paired remains.

Thus, in the buffer section 401-k in a second embodiment, the output impedance as a buffer element specific characteristic is low, a portion between the non-inverting input terminal and the inverting input terminal of the operational amplifier 500 configuring the buffer section is insulated, and only a small parasitic capacity exists there. Thus, since the disturbance of the signal generated on the output side of the buffer section 401-k is nearly not transmitted to the input side of the buffer section, the disturbance component transmitted through the parasitic capacity is also voltage-divided according to a ratio of a magnitude of the parasitic capacity between the capacity of the capacitor 501 and the input terminal of the operational amplifier 500, the disturbance component of the signal transmitted to the input signal side is very small. As described above, in the embodiment, it is possible to suppress transmission of the kickback component to another ADC 101-*k* and it is possible to also solve the kickback problem and to secure the effective resolution between the ADCs that are not paired by providing the buffer section 401-*k*.

Third Embodiment

Figure 5:
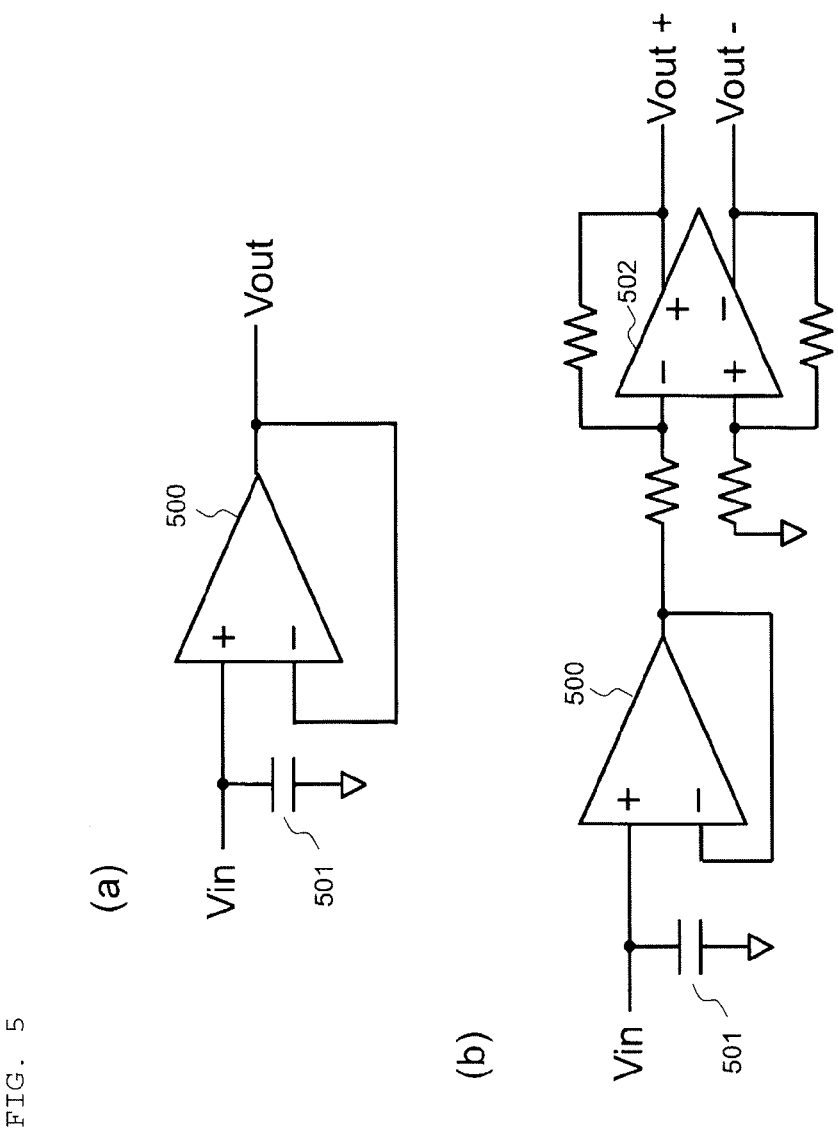
FIG. 5 is a diagram describing an embodiment of a buffer section in the second embodiment.
Figure 6:
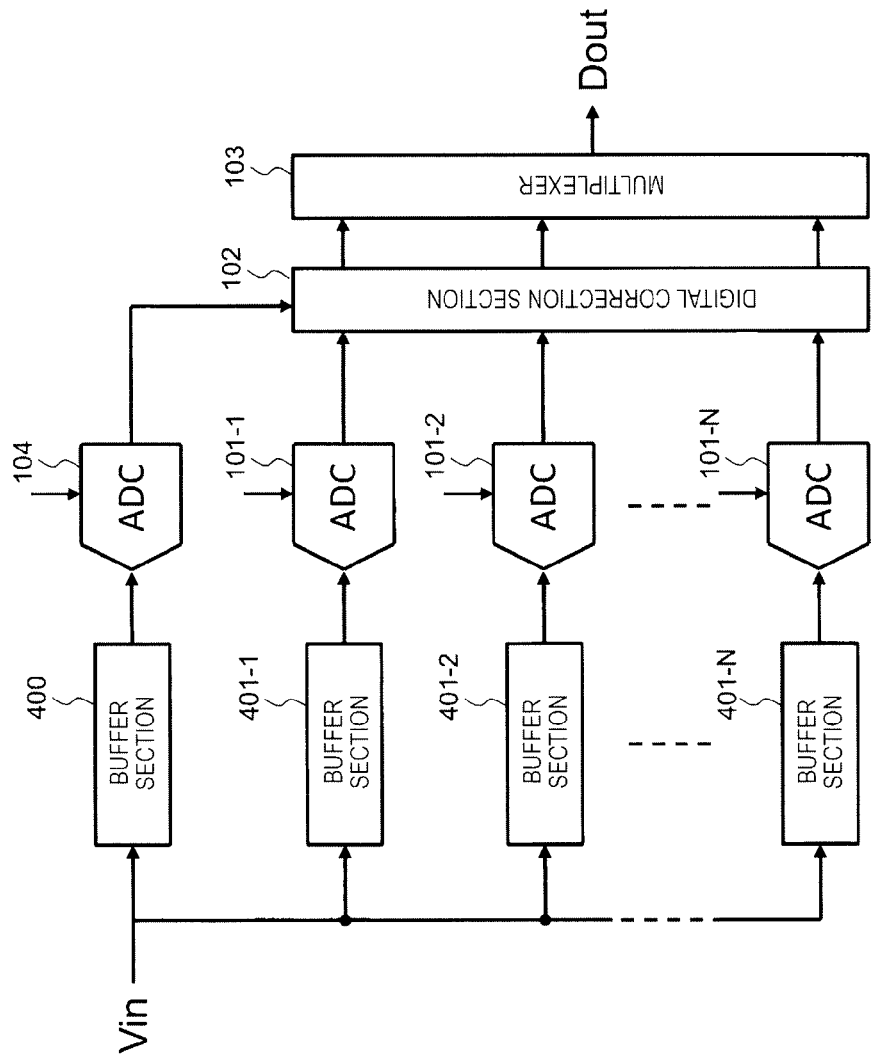
FIG. 6 is a diagram describing a third embodiment.

FIG. 5 illustrates an embodiment of an interleaved ADC according to a third embodiment.

The embodiment is provided to digitally correct characteristics of a buffer section to prevent degradation of the characteristics by providing the buffer section disclosed in the second embodiment.

The embodiment is configured of N ADCs 101-*k* (k=natural number of 1 to N), the buffer sections 401-*k* respectively connected to an analog input terminal of the ADC 101-*k*, the multiplexer 103 connected to an output terminal of the digital correction section 102 connected to each ADC 101-*k*, the buffer section 400 of which an input terminal is connected to a common input signal line, and the reference ADC 104 of which an input terminal is connected to an output terminal of the buffer section 400.

Here, the ADC 101-*k* and the reference ADC 104 include input sampling circuits. An analogue signal Vin is input into each buffer section 401-*k* and a sampling clock signal having a frequency fs is input into the ADC 101-*k*. An digital output of each ADC 101-*k* is connected to the digital correction section 102. A mismatch between AD conversion paths such as DC offset, deviation of conversion gain, and a shift of sampling timing that occur in an AD conversion path is corrected from comparison with an output of the ADC 104. The correction can be performed similarly to the method described in the first embodiment. Furthermore, in the embodiment, the digital correction section 102 corrects a voltage offset, a voltage gain, and deviation of a signal band of the buffer section 401-*k* and the buffer section 400. An AD conversion result of each ADC 101-*k* corrected by the digital correction section 102 is integrated by the multiplexer 103 and is output as a series of a series of a time-series data. Furthermore, sampling clock signals input into each ADC 101-*k* have phase differences from each other and a phase difference of approximately 1/(fs·N) is provided between the sampling clock signals which are the closest to each other.

Hereinafter, effects of the configuration will be described.

A characteristic of the embodiment is that the digital correction section 102 simultaneously corrects a variation of the characteristics and, particularly, a variation of a signal band generated by the buffer section 401-*k*.

Since the analog signal passes through the buffer section that is different for each of the AD conversion paths of the interleaved ADC, the analog signal receives influence of the variation of the signal band of an operational amplifier configuring the buffer section 401-*k*. Such a variation of the signal band of the buffer section also causes a decrease in the resolution of the AD conversion result combined by the multiplexer 103 similar to other variations.

Here, the digital correction section 102 specifies a mismatch amount between the paths, recalculates a digital output value of each ADC 101-*k* so as to cancel the mismatch, and outputs the output value to the multiplexer by periodically comparing the sampling of each ADC 101-*k* and the AD conversion result of the ADC 104, and the AD conversion result of the ADC 101-*k*. A configuration of the digital correction section is similar to the configuration of FIG. 2, correction parameters of the signal band become the same parameters as the correction parameters of the sampling timing described in the first embodiment, and it is possible to prevent the decrease in the resolution due to the mismatch between the paths. The reason is as follows.

Frequency characteristics of the buffer section 401-*k* can be generally represented as a transfer function of Equation 1.

[Equation 1]

$$G_f(s) = \frac{1}{1 + as + bs^2} \quad \text{(Equation 1)}$$

Here, when j is imaginary unit, ω is an angle frequency of the input signal, s=j×ω, and a and b are respectively constants depending on the frequency characteristics of the buffer section 401-*k*. The above equation can perform approximation of a form of Expression 2 in a frequency band lower than the frequency band of the buffer section 401-*k*.

[Equation 2]

$$G_f(s) = 1 - as - )b - a^2)s^2 \quad \text{(Equation 2)}$$

Meanwhile, when a shift of the sampling timing from an ideal value is Δt, the AD conversion result receiving influence of Δt can be represented by a transfer function as Equation 3.

[Equation 3]

$$G_{\Delta t}(s) = 1 + \Delta t s + \frac{\Delta t^2}{2} s^2 \quad \text{(Equation 3)}$$

Here, a component of Δt×s+(Δt²)/2×s² is an error generated by Δt. In the digital correction of the sampling timing described above in the first embodiment, Δt that is a coefficient of s and Δt²/2 that is a coefficient of s² are obtained, and a process of subtracting a calculated error term from the AD conversion result is performed. Here, if the influence due to the error of the sampling timing and the influence generated by the frequency characteristics of the buffer simultaneously occur, it is possible to represent a transfer function as Equation 4 from Equation 2 and Equation 3.

[Equation 4]

$$G_{\Delta t,f} = 1 + (\Delta t - a)s + \left(\frac{\Delta t^2}{2} - b + a^2\right)s^2 \quad \text{(Equation 4)}$$

Since influence of the error of the sampling timing and the error of the frequency characteristics between the buffer sections can be corrected by obtaining the coefficient of s and the coefficient of s² using Equation 4, the influence can be corrected by a method similar to the method described in the first embodiment. In the embodiment, the mismatch of the sampling timing and the mismatch of the frequency characteristics between the buffer sections are simultaneously corrected by obtaining the coefficients. Furthermore, the gain correction of the buffer section and the offset correction can be performed with the configuration of FIG. 2 similar to the first embodiment and it is possible to further prevent the decrease in the effective resolution.

Fourth Embodiment

Figure 7:
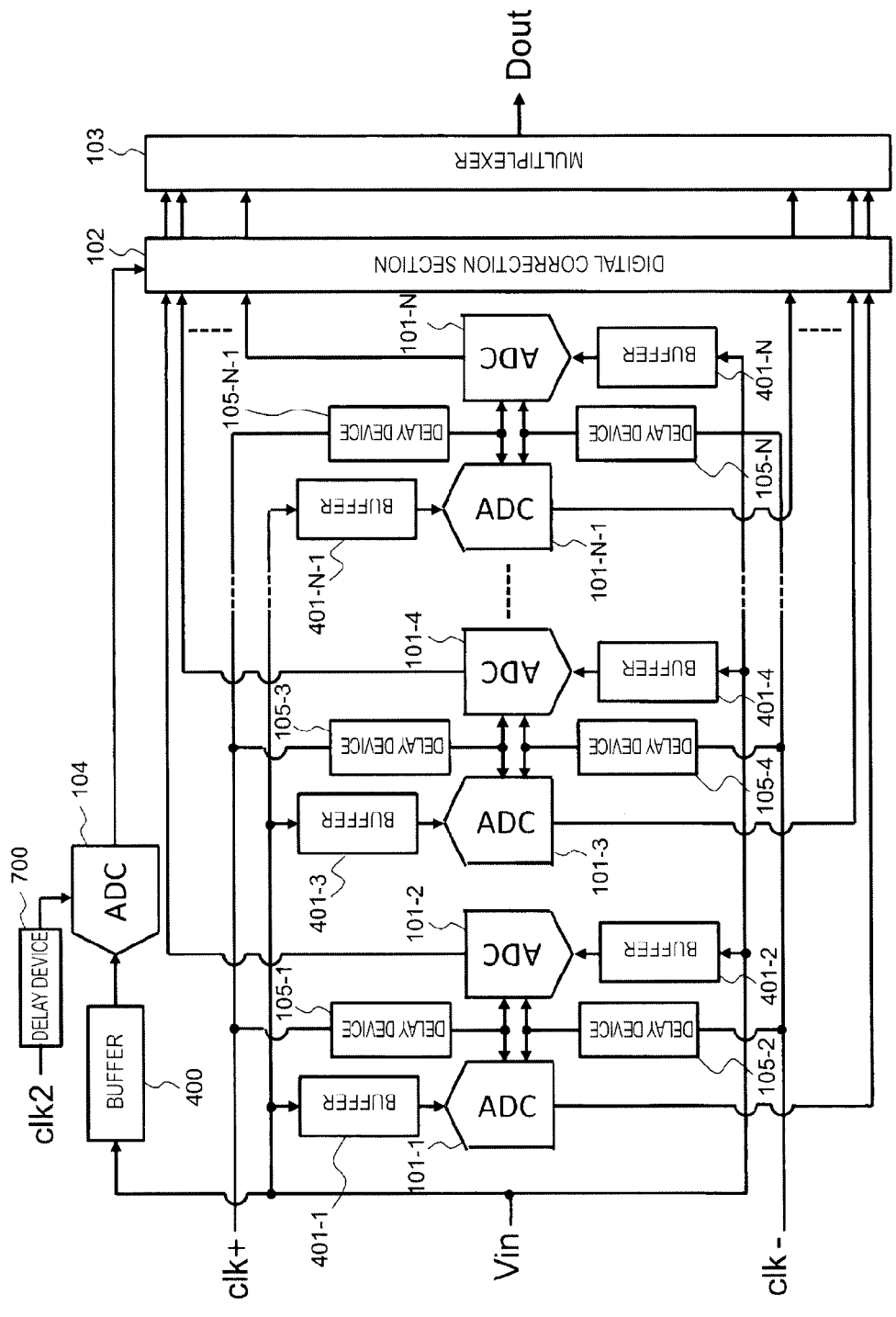
FIG. 7 is a diagram describing a fourth embodiment.

FIG. 7 illustrates an embodiment of an interleaved ADC according to a fourth embodiment.

The embodiment includes a simultaneous correction structure of a mismatch of characteristics between the buffer sections and the sampling timing described in the third embodiment and a delay device 700 that is capable of adjusting a phase of a clock input into the reference ADC 104 in addition to the second embodiment.

In the embodiment, analog input terminals of N ADCs 101-$k$ ($k$=an integer of 1 to N and n is a multiple of 2) having differential input clock terminals are connected to a common analog input signal line.

Furthermore, an output of each ADC 101-$k$ is connected to the multiplexer 103. Each ADC 101-1 (1 is an odd number of 1 to N) has the ADC 101-$m$ ($m$ is an even number of 1 to N) to be paired, a positive input clock terminal of each ADC 101-1 is connected to a negative input clock terminal of the ADC 101-$m$ to be paired, and a negative input clock terminal of each ADC 101-1 is connected to a positive input clock terminal of the ADC 101-$m$ to be paired.

A differential clock signal line is connected to a differential input clock terminal of the ADC 101-1 and the ADC 101-$m$ connected to each other and the sampling clock signal of a frequency fs is input into the differential input clock terminal. At this time, the sampling clock signal input into each differential clock signal line is distributed in N/2 types of clocks having a phase of $k/(fs·N)$ ($k$ is a natural number from to N/2−1) generated by the delay device 105-$k$ from differential clock signals (clk+ and clk−) as the reference.

Here, the differential clock signals (clk+ and clk−) may be generated by using a balance-unbalance converter or an element converting a signal-ended signal into a differential signal and may be directly generated as the differential signal from a clock generator.

Furthermore, two positive and negative signal lines of the differential input signal line may be respectively connected to one of two signal lines connecting between the clock terminals of the ADC 101-1 and the ADC 101-$m$.

Furthermore, the embodiment includes the reference ADC 104 that is connected in parallel to the analog input signal line and a digital correction section that corrects an output result of the ADC 101-$k$ on the basis of a comparison result of outputs of the ADC 104 and each ADC 101-$k$.

In the embodiment, furthermore, the buffer sections 401-$k$ and 400 are connected between analog input terminals of each ADC 101-$k$ and the reference ADC 104, and the common input signal line. The digital correction section simultaneously calculates the variation of the characteristics such as an delay error generated between the delay devices 105-$k$ and the input frequency band generated between the input buffers 401-$k$, and a corrected output value of the ADC 101-$k$ is obtained on the basis thereof from a comparison value between the output of the ADC 104 and the output of the ADC 101-$k$.

Thus, each ADC 101-$k$ secures a period during which the disturbance of the input signal generated at an edge timing of the sampling clock signal input therein is adjusted and to prevent decreasing of accuracy of each delay device and the effective resolution due to the deviation of the characteristics of the buffer section while directly preventing flow-out of the disturbance component with respect to the common input signal.

In addition, the embodiment includes the delay device 700 that is capable of adjusting the delay amount on the clock signal line, which is input into the reference ADC 104.

Hereinafter, effects of the embodiment will be described.

Figure 8:
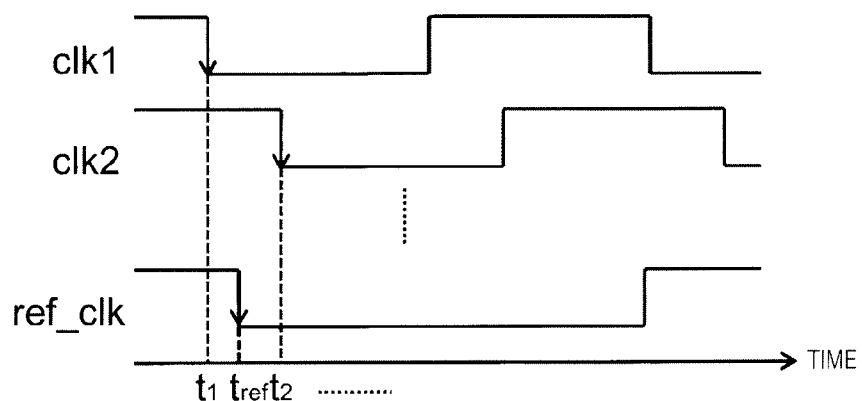
FIG. 8 is a diagram describing a phase relationship of a clock in a sixth embodiment.

Here, FIG. 8 illustrates a phase relationship of the clocks input into the reference ADC 104 and each ADC 101-$k$. The clk1 and the clk2 illustrate any two types of the sampling clock signals having the smallest phase difference between the sampling clock signals input into one of the ADCs 101-$k$.

Here, t1 and t2 respectively illustrate clock falling times of the clk1 and clk2. Furthermore, a ref_clk is the sampling clock input into the reference ADC 104 and is a clock that is a reference when correcting the sampling timing of the ADC 101-$k$.

A tref illustrates a clock falling time of the ref_clk and t1 and t2 have a time difference of approximately $1/(fs·N)$. The interval determines the sampling interval of the interleaved ADC. The digital correction section compares a value that is obtained by performing the AD conversion by the ADC 101-$k$ at the time t1 and a value that is obtained by performing the AD conversion by the reference ADC 104 at the time tref, and corrects the influence due to the shift of t1 by calculating the correction value. It is impossible to accurately calculate the correction value if tref and t1 are too far apart.

Thus, since it is necessary to approximate t1 to tref, it is necessary to increase the delay amount of the clk1. However, since it is necessary to maintain t1 and t2 at appropriately $1/(fs·N)$, the delay amount of the clk2 has to be increased. Thus, although delay amounts of all clks have to be increased together, generally, since it causes an increase in the delay circuit when increasing the delay amount in the delay device, that is undesirable for mounting.

Furthermore, generally, since an adjustment width of the delay amount and adjustment accuracy of the delay of the delay device are traded off, it is preferable that an adjustment range of the delay amount is reduced.

Thus, in the configuration, the ref_clk itself is delayed by the delay device 700 provided on the path of the ref_clk input into the reference ADC 104.

Thus, it is possible to approximate the tref to t2 by delaying the tref. If the phase relationship between the sampling clock signals input into each ADC 101-$k$ is maintained at approximately $1/(fs·N)$ and a falling edge of the ref_clk matches a falling edge of the sampling clock signal input into any one of the ADCs 101-$k$ at any timing, a falling edge of other ADC can be periodically synchronized with one of falling edges of the ref_clk.

Therefore, as a result, the falling edges of the clock inputs of all ADCs 101-$k$ can be periodically synchronized with one of falling edges of the ref_clk.

An effect is obtained that makes the timing of the ref_clk match a range in which the digital correction can be performed while preventing a decrease in the adjustment accuracy of the delay and an increase in a circuit scale of the delay device 105-$k$ for the ADC 101-$k$ by the mechanism described above.

REFERENCE SIGNS LIST

101-1 to 101-N: ADC
102: digital correction section
103: multiplexer
104: reference ADC
105-1 to 105-N: delay device
201-1 to 201-N: gain correction section
202-1 to 202-N: offset correction section
203-1 to 203-N: skew correction section
204-1 to 204-N: subtractor
205-1 to 205-N: multiplier
206-1 to 206-N: adder 207-1 to 207-N: delay device
208-1 to 208-N: multiplier
209-1 to 209-N: multiplier
210-1 to 210-N: adder
211-1 to 211-N: delay device
212-1 to 212-N: adder
213-1 to 213-N: multiplier
214-1 to 214-N: adder
215-1 to 215-N: delay device
216-1 to 216-N: multiplier
217-1 to 217-N: delay device
218-1 to 218-N: adder
300: resistance
301: capacitor
302: inductance
303: variable capacitor
400: buffer section
401-1 to 401-N: buffer section
500: operational amplifier
501: capacitor
502: differential output operational amplifier
700: delay device
901-1 to 901-K: delay device
902-1 to 902-K: tap section
903: adder

The invention claimed is:

1. A time interleaved A/D converter configured of a plurality of unit A/D converters,
wherein a first clock signal line of one side of one set of two differential clock signal lines is input into a positive input clock terminal of a first unit A/D converter configuring the time interleaved A/D converter and into a negative input clock terminal of a second unit A/D converter configuring the time interleaved A/D converter as a set with the first unit A/D converter, and a second clock signal line that is a clock signal line on a side different from the first clock signal line of the differential clock signal lines is input into a negative input clock terminal of the first A/D converter and into a positive input clock terminal of the second A/D converter.

2. The time interleaved A/D converter according to claim 1, wherein a shift of each sampling clock input into each unit A/D converter from ideal sampling timing is corrected by subtracting a value that is obtained by multiplying a value corresponding to an timing error from the ideal sampling timing by a value corresponding to a differential value of an output of each unit A/D converter in each digital correction section provided after each unit A/D converter from the output of each unit A/D converter.

3. The time interleaved A/D converter according to claim 2, wherein digital correction is performed by using a conversion result of a reference A/D converter for sampling of an analog input voltage common with each unit A/D converter.

4. The time interleaved A/D converter according to claim 3, wherein the plurality of analog input buffers are connected to the subsequent stage of common analog input signal line and the unit A/D converter is connected to the subsequent stage of each input buffer.

5. The time interleaved A/D converter according to claim 2, wherein the plurality of analog input buffers are connected to the subsequent stage of the common analog input signal line and the unit A/D converter is connected to the subsequent stage of each input buffer.

6. The time interleaved A/D converter according to claim 1, wherein a plurality of analog input buffers are connected to a subsequent stage of a common analog input signal line and the unit A/D converter is connected to a subsequent stage of each input buffer.

7. The time interleaved A/D converter according to claim 1, wherein a plurality of analog input buffers are connected to a subsequent stage of a common analog input signal line, the unit A/D converter is connected to a subsequent stage of the input buffer, and in a digital correction section provided immediately after each unit A/D converter, any one of correction of a buffer gain by multiplying a value corresponding to an ideal gain of a buffer section by an output of each unit A/D converter, correction of DC offset by subtracting a value corresponding to an ideal DC offset voltage value from an output of each unit A/D converter, and signal bandwidth correction between the buffers by subtracting a value obtained by multiplying a value corresponding to a deferential value of the output of each unit A/D converter by a value corresponding to an error from an ideal buffer frequency band from the output of each unit A/D converter, is performed.

8. The time interleaved A/D converter according to claim 7, wherein a shift from an ideal time of a sampling clock is corrected by the digital correction section provided after each unit A/D converter.

9. The time interleaved A/D converter according to claim 7, wherein digital correction is performed by using a conversion result of a reference A/D converter for sampling a common analog input voltage.

10. The time interleaved A/D converter according to claim 9, wherein a shift from an ideal time of a sampling clock is corrected by the digital correction section provided after each unit A/D converter.

11. The time interleaved A/D converter according to claim 10 further comprising:
a phase delay circuit that is capable of adjusting a phase of a sampling clock signal input into the reference A/D converter.

12. The time interleaved A/D converter according to claim 10, wherein a phase delay circuit that is capable of adjusting a phase of a sampling clock signal inputting into the reference A/D converter is provided in the A/D converter according to claim 10.

13. The time interleaved A/D converter according to claim 1, wherein a phase difference of the sampling clock is created by an LC filter.

14. The time interleaved A/D converter according to claim 12, wherein delay of at least one of sampling clocks inputting into the A/D converter is created by an LC filter.

15. A time interleaved A/D converter configured of a plurality of unit A/D converters,
wherein a plurality of analog input buffers are connected to a subsequent stage of a common analog input signal line, the unit A/D converter is connected to a subsequent stage of the input buffer, and in a digital correction section provided immediately after each unit A/D converter, any one of correction of a buffer gain by multiplying a value corresponding to an ideal gain of a buffer section by an output of each unit A/D converter, correction of DC offset by subtracting a value corresponding to an ideal DC offset voltage value from an output of each unit A/D converter, and signal bandwidth corrections between the buffers by subtracting a value obtained by multiplying a value corresponding to a deferential value of the output of each unit A/D converter by a value corresponding to an error from an ideal buffer frequency band from the output of each unit A/D converter, is performed.

16. The time interleaved A/D converter according to claim 15,
wherein digital correction is performed by using a conversion result of a reference A/D converter for sampling a common analog input voltage.

17. The time interleaved A/D converter according to claim 16,
wherein a shift from an ideal time of a sampling clock is corrected by the digital correction section provided after each unit A/D converter.

\* \* \* \* \*